United States Patent
Liao et al.

(10) Patent No.: US 7,696,564 B1
(45) Date of Patent: Apr. 13, 2010

(54) LATERAL DIFFUSED METAL-OXIDE-SEMICONDUCTOR FIELD-EFFECT TRANSISTOR

(75) Inventors: Tsuoe-Hsiang Liao, Hsinchu (TW); Bing-Yao Fan, Hsinchu (TW); Yi-Ju Liu, Hsinchu (TW)

(73) Assignee: Agamem Microelectronics Inc., Hsinchu (TW)

( * ) Notice: Subject to any disclaimer, the term of this patent is extended or adjusted under 35 U.S.C. 154(b) by 0 days.

(21) Appl. No.: 12/436,120

(22) Filed: May 6, 2009

(51) Int. Cl.
*H01L 29/76* (2006.01)
*H01L 29/94* (2006.01)

(52) U.S. Cl. .................. 257/328; 385/147; 257/327; 257/335; 257/336; 257/343; 257/344

(58) Field of Classification Search ............. 385/147; 257/327, 328, 335, 336, 343, 344
See application file for complete search history.

(56) References Cited

U.S. PATENT DOCUMENTS 5,589,409 A * 12/1996 Bulucea et al. ............. 438/377
7,145,203 B2 * 12/2006 Wang ......................... 257/339

* cited by examiner

*Primary Examiner*—Jennifer Doan

(57) ABSTRACT

A lateral diffused metal-oxide-semiconductor field-effect transistor structure including a P substrate, an N+ buried layer, an N epitaxial layer, a P well, an N well, a drain region, a source region, and a body region is disclosed. The N+ buried layer is located between the P substrate and the N epitaxial layer, the P well contacts the N+ buried layer, the source region and the body region are located in the P well, the N well is located in the N epitaxial layer, and the drain region is located in the N well. When a high voltage is applied to the drain and the P substrate is grounded, a breakdown voltage with the P substrate is raised because of the N+ buried layer isolating the P substrate from the N epitaxial layer, so as to be able to avoid PN junction breakdown.

4 Claims, 2 Drawing Sheets

LATERAL DIFFUSED METAL-OXIDE-SEMICONDUCTOR FIELD-EFFECT TRANSISTOR

BACKGROUND OF THE INVENTION

1. Field of the Invention

The present invention relates to a lateral diffused metal-oxide-semiconductor field-effect transistor structure, and more particularly, to a lateral diffused metal-oxide-semiconductor field-effect transistor in which a P substrate and an N epitaxial layer are isolated by an N+ buried layer.

2. The Prior Art

As the semiconductor industry develops, high power components are often applied in many aspects of power electronics. Since a lateral diffused metal-oxide-semiconductor field-effect transistor (LDMOS) is more easily compatible with the complementary metal-oxide-semiconductor (CMOS) process, thus LDMOS is widely used.

Referring to FIG. 1, a view of LDMOS according to prior art is shown. As shown in FIG. 1, LDMOS 1 according to prior art includes a P substrate 10, a P+ buried layer 12, an N epitaxial layer 30, a P well 40, an N well 50, a drain region, a source region, and a body region, wherein the P+ buried layer 12 is located between the P substrate 10 and the P well 40, and the N epitaxial layer 30 is on the P substrate 10.

The N well 50 is in the N epitaxial layer 30, and the drain region is on the N well 50. The drain region includes a high voltage N drain layer 62 and an N+ drain layer 64. The N+ drain layer 64 is on the high voltage N drain layer 62 and connects with a plurality of drain terminals D.

The drain region and the body region are located in P well 40. The source region includes a high voltage N source layer 72 and an N+ source layer 74. The N+ source layer 74 is on the high voltage N source layer 72 and connects with a plurality of source terminals S. The body region includes P+ body contact layer 82 and connects with a plurality of body terminals B.

LDMOS 1 also includes a thick oxide isolation region 92 and a P bottom isolation layer 94 and thereby avoids high voltage connection lines (not shown) on the thick oxide isolation region 92 to accidentally turn on the N epitaxial layer 30 under the P bottom isolation layer 94.

LDMOS 1 also includes a protective layer 110, which covers a drain region, a source region, a body region, and a thick oxide isolation region 92, for providing protection.

Generally speaking, when LDMOS is turned on, the drain terminals D connect to a high voltage, such as 600 V, the source terminals S is grounded, and a positive voltage higher than a threshold voltage of the LDMOS 1 is applied to the body terminals B. Accordingly, the LDMOS 1 is turned on, and a high current flows from the drain terminals D to the source terminals S. Therefore, an on-resistance Ron from the drain terminals D to the source terminals S is the smaller the better, so as to make the ohmic consumption power lower, reduce a rise of the temperature of LDMOS, and improve the lifetime and the reliability of components. The plurality of drain terminals D are used to increase the effective width of channels, which is a commonly used method for reducing on-resistance. In addition, it may also reduce a distance between the drain region and the source region to achieve the purpose of reducing on-resistance. However, there may be a negative effect of lowering breakdown voltage.

When LDMOS 1 is turned off, the drain terminals D connect with a high voltage (600 V), and the source terminals S and the body terminals B are grounded, so that the LDMOS 1 is turned off. At this time, the connection lines (not shown) connecting with the drain terminals D have a high voltage of 600 V, and a breakdown between the drain region and the source region of LDMOS 1 may happen so that LDMOS 1 fails or is even permanently damaged. Although the thick oxide isolation region 92 may improve protection, the effect is still quite limited. As a result, an LDMOS structure which may ensure PN junction breakdown not occur is needed.

SUMMARY OF THE INVENTION

The main object of the present invention is to provide an LDMOS structure, including a P substrate, an N+ buried layer, an N epitaxial layer, a P well, an N well, a drain region, a source region, and a body region, wherein the N+ buried layer is located between the P substrate and the N epitaxial layer, the P well contacts the N+ buried layer, the source region and the body region are located in the P well, the N well is located in the N epitaxial layer, the drain region is located in the N well. The N+ buried layer isolated the P substrate from the N epitaxial layer, thereby a PN junction breakdown voltage with the P substrate is raised, so as to ensure when the components are operated, the high voltage connection lines from the drain region may not cause PN junction breakdown. Accordingly, the present invention may solve the above-mentioned defects of prior art, and improve the reliability of semiconductor components.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Reference will now be made in detail to an embodiment of the present invention, examples of which are illustrated in the accompanying drawings.

Figure 1:
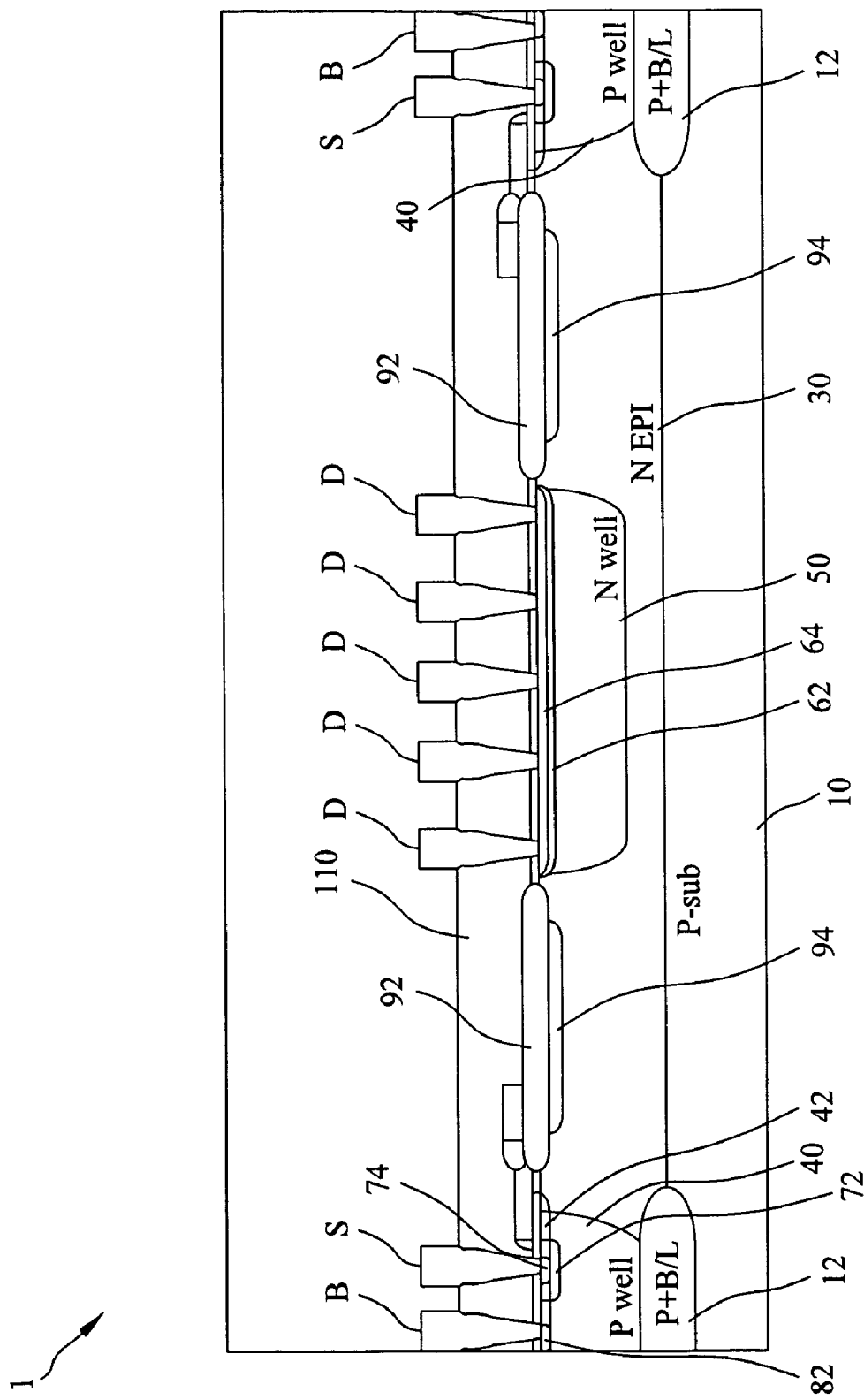
FIG. 1 is a view of LDMOS according to prior art.
Figure 2:
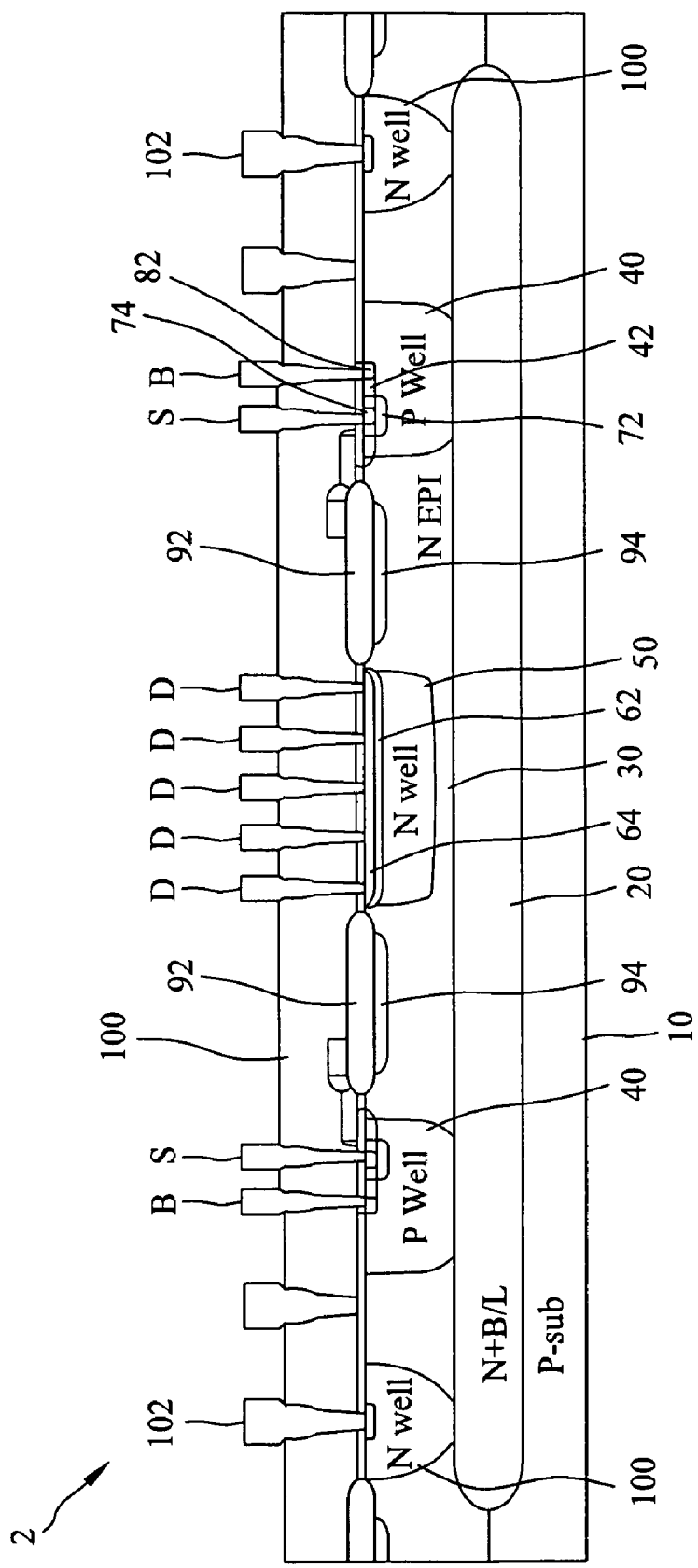
FIG. 2 is a view of LDMOS structure according to the present invention.

Referring to FIG. 2, a view of LDMOS structure is shown. As shown in FIG. 2, LDMOS 2 of the present invention includes a P substrate 10, an N+ buried layer 20, an N epitaxial layer 30, a P well 40, an N well 50, a drain region, a source region, and a body region. The N+ buried layer 20 is located between the P substrate 10 and the N epitaxial layer 30. The P well 40 has a first depth, and is located in the N epitaxial layer 30 and contacts the N+ buried layer 20, further includes a P layer 42. The source region and the body region are located in the P layer 42 of the P well 40. N well 50 is located in the N epitaxial layer 30, and does not contact N+ buried layer 20. The drain region is located in the N well 50.

The drain region includes a high voltage N drain layer 62 and an N+ drain layer 64 sequentially stacking bottom-up, and the N+ drain layer 64 connects with a plurality of drain terminals D.

The source region includes a high voltage N source layer 72 and an N+ source layer 74, wherein the N+ source layer 74 is on the high voltage N source layer 72, and the N+ source layer 74 connects with a plurality of source terminals S. The high voltage N source layer 72 has a second depth higher than the first depth of the P well 40.

The body region includes a P+ body contact layer 82, which is located in the P well 40, and connects with a plurality of body terminals B.

The LDMOS 2 of the present invention also includes a field oxide isolation region, which is located between the drain region and the source region, and in the N epitaxial layer 30. The field oxide isolation region includes a thick oxide isolation region 92 and a P bottom isolation layer 94 sequentially stacking bottom-up. As a result, the threshold voltage of the N epitaxial layer 30 under the P bottom isolation layer 94 is raised to avoid high voltage connection lines (not shown) on the thick oxide isolation region 92 to accidentally turn on the N epitaxial layer 30 under the P bottom isolation layer 94.

LDMOS 2 of the present invention also includes an N well guard ring 100, which connects to the N+ buried layer 20, and is located outside of the P well 40 and surrounds the same. The N well guard ring 100 does not contact the P well 40, and a plurality of guard ring terminals 102 connect with the N well guard ring 100.

Furthermore, LDMOS 2 of the present invention also includes a protective layer 110, which covers the drain region, the source region, the body region, and the thick oxide isolation region, to provide protection. The protective layer 110 has a plurality of through holes allowing the drain terminals D, the source terminals S, the body terminals B, and the guard ring terminals 102 to connect to connection lines (not shown). The protective layer 110 comprises an electrical insulation material, and the electrical insulation material includes one of silica and silicon nitride.

Since the N+ buried layer 20 blocks the breakdown between the P substrate 10 and the N epitaxial layer 30, therefore, when applying a high voltage, such as 600 V, to the drain terminals D and the body terminals B grounding, it may substantially raise the breakdown voltage between the drain region and the body region. Thus, the high voltage connection lines (not shown) on the thick oxide isolation region may not cause PN junction breakdown, so that a normal operation of LDMOS 2 is assured.

The P substrate 10 has a first P doping concentration, the P well 40 has a second P doping concentration, the P layer 42 and the P bottom isolation layer 94 has a third P doping concentration, the P+ body contact layer 82 has a fourth P doping concentration. The second P doping concentration is higher than the first P doping concentration, the third P doping concentration is higher than the second P doping concentration, and the fourth P doping concentration is higher than the third P doping concentration. Any of the first P doping concentration, the second P doping concentration, the third P doping concentration, and the fourth P doping concentration is a concentration including one of boron, aluminum, gallium, and indium.

The N+ buried layer 20 has a first N doping concentration, the N epitaxial layer 30 has a second N doping concentration, the N well 50 has a third N doping concentration, the high voltage N drain layer 62 and the high voltage N source layer 72 have a fourth N doping concentration, and the N+ drain layer and the N+ source layer 74 have a fifth N doping concentration. The second N doping concentration is lower than the first N doping concentration, the third N doping concentration is lower than the first N doping concentration and higher than the second doping concentration, the fourth N doping concentration is higher than the third N doping concentration, and the fifth doping concentration is higher than the fourth N doping concentration. Any of the first N doping concentration, the second N doping concentration, the third N doping concentration, the fourth N doping concentration, and the fifth N doping concentration is a concentration including one of nitrogen, phosphorus, arsenic, and tellurium.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A lateral diffused metal-oxide-semiconductor field-effect transistor structure comprising:

a P substrate with a first P doping concentration;

an N+ buried layer, which is located on the P substrate, and has a first N doping concentration;

an N epitaxial layer, which is located on the N+ buried layer, and has a second N doping concentration lower than the first N doping concentration;

a P well, which is located in the N epitaxial layer, contacts the N+ buried layer, comprises a P layer, and has a first depth and a second P doping concentration, wherein the second P doping concentration is higher than the first P doping concentration, and the P layer has a third P doping concentration higher than the second P doping concentration;

an N well, which is located in the N epitaxial layer, has a third N doping concentration lower than the first N doping concentration and higher than the second N doping concentration;

a drain region, which is located in the N well, comprises a high voltage N drain layer and an N+ drain layer sequentially stacking bottom-top, and the N+ drain layer connects with a plurality of drain terminals, wherein the high voltage N drain layer has a fourth N doping concentration, and the N+ drain layer has a fifth N doping concentration, the fourth N doping concentration is higher than the third N doping concentration, the fifth N doping concentration is higher than the fourth N doping concentration;

a source region, which is located in the P layer of the P well, comprises a high voltage N source layer and an N+ source layer, and the N+ source layer is located in the high voltage N source layer, wherein the high voltage N source layer has the fourth N doping concentration, the N+ source layer has the fifth N doping concentration, the high voltage N source layer has a second depth higher than the first depth, and the source region connects with a plurality of source terminals;

a body region, which is located in the P layer of the P well, comprises a P+ body contact layer which contacts the P well, wherein the P+ body contact layer has a fourth P doping concentration higher than the third P doping concentration, and the P+ body contact layer connects with a plurality of body terminals;

a field oxide isolation region, which is located between the drain region and the source region, and is in the N epitaxial layer, comprises a thick oxide isolation region and a P bottom isolation layer sequentially stacking bottom-up, wherein the P bottom isolation layer has the third P doping concentration;

an N well guard ring, which contacts the N+ buried layer and is located outside of the P well and surrounds the same, does not contact the P well, connects with a plurality of guard ring terminals, and has the third N doping concentration; and a protective layer, which covers the drain region, the source region, the body region and the thick oxide isolation region, having a plurality of through holes, which allow the drain terminals, the source terminals, the body terminals and the guard ring terminals to connect to connection lines, wherein the protective layer comprises an electrical insulation material.

2. The lateral diffused metal-oxide-semiconductor field-effect transistor structure of claim 1, wherein any of the first P doping concentration, the second P doping concentration, the third P doping concentration, and the fourth P doping concentration is a concentration including one of boron, aluminum, gallium, and indium.

3. The lateral diffused metal-oxide-semiconductor field-effect transistor structure of claim 1, wherein any of the first N doping concentration, the second N doping concentration, the third N doping concentration, the fourth N doping concentration, and the fifth N doping concentration is a concentration including one of nitrogen, phosphorus, arsenic, and tellurium.

4. The lateral diffused metal-oxide-semiconductor field-effect transistor structure of claim 1, wherein the electrical insulation material comprises one of silica and silicon nitride.

* * * * *